United States Patent [19]
Liu et al.

[11] Patent Number: 5,359,564
[45] Date of Patent: Oct. 25, 1994

[54] CONTENT ADDRESSABLE MEMORY SYSTEM AND METHOD OF OPERATION

[75] Inventors: Pei-chun P. Liu; Karl Wang, both of Austin, Tex.

[73] Assignee: Motorola, Inc., Schaumburg, Ill.

[21] Appl. No.: 55,897

[22] Filed: May 4, 1993

[51] Int. Cl.$^5$ .............................................. G11C 15/00
[52] U.S. Cl. ................... 365/49; 365/189.05; 365/230.08; 365/233
[58] Field of Search ............... 365/49, 189.05, 230.08, 365/233; 395/425, 375

[56] References Cited

U.S. PATENT DOCUMENTS 5,130,947  7/1992  Reed ..................................... 365/49
5,249,282  9/1993  Sergers ................................ 395/425

*Primary Examiner*—Eugene R. LaRoche
*Assistant Examiner*—H. Hoang
*Attorney, Agent, or Firm*—Lee E. Chastain

[57] ABSTRACT

A content addressable memory system has a plurality of associated circuit sets (12). Each circuit set has a tag memory element, a latching circuit and a data memory element. Each tag memory element stores a received tag in a first mode of operation and compares a received data tag to a stored data tag in a second mode of operation. In the second mode of operation, the tag memory element couples a first voltage supply terminal to an associated node in response to the comparison. Each latching circuit latches the voltage level present on its associated node during a first phase of a control signal. Each data memory element stores a data word and outputs the data word responsive to the latched voltage level of the associated latching circuit. The latching circuit continues to latch the voltage level and the data memory element continues to output its data word for an entire clock cycle. Each latching circuit couples its associated node to a second voltage supply terminal during a first phase of the control signal.

8 Claims, 2 Drawing Sheets

CONTENT ADDRESSABLE MEMORY SYSTEM AND METHOD OF OPERATION

FIELD OF THE INVENTION

The present invention generally relates to digital memory systems, and more specifically to a content addressable memory.

BACKGROUND OF THE INVENTION

A content addressable memory system (hereafter simply a CAM system) is a memory system in which individual memory elements are not exclusively indexed by a unique address. Instead, a memory element in a CAM system may be addressed by a portion of the data within the memory element. The way in which a memory cell in a CAM system is addressed distinguishes a CAM system from a conventional random access memory (RAM) or a read only memory (ROM).

A particular data word stored in a RAM cell or a ROM cell is accessed by supplying a unique address to the memory system associated with the desired memory element. In a CAM memory system, a "tag" is supplied to the memory system. The CAM memory system compares the tag to a subset of the data bits contained in each memory element. Generally, the portion of each memory element that contains this subset of memory bits is referred to as the CAM. Each CAM is associated with a conventional memory element containing other data bits. The CAM (or CAMs) that contains data bits logically equivalent to the input tag "matches" and asserts a logic signal referred to as a "matchline." The asserted matchline causes the CAM memory system to output the other data bits associated with the matching CAM. The other data bits are the desired data word. The number of matches depends upon the particular implementation of the CAM and its operation history. The number of matches may range from zero to the number of memory elements within the CAM memory system.

CAM memory systems are often used as high speed memory caches in data processing applications. In a data processing application, each CAM contains data corresponding to a unique address of the other data bits associated with the CAM. During operation, the data processing system periodically requests data associated with a unique address. The data processing system first compares the unique address to the contents of each CAM. If any CAM matches the unique address, then the CAM memory system forwards the data associated with the matching CAM to the data processing system. If no CAM matches the input tag, then the data processing system forwards the unique address to a conventional, slower RAM system.

The operation of CAM systems is known in the art. Generally, during a first phase of a clock signal each of a set of matchline nodes is precharged to a voltage level corresponding to a high logic level. During a second phase of the clock signal, a tag is input to each CAM and a comparison made between each bit of the tag and a corresponding bit within the CAM. Each bit within a CAM may discharge the matchline node corresponding to the memory element if the bit does not match the corresponding tag bit. If all tag bits match the corresponding bits within a particular CAM, then no bit discharges the matchline node. According to conventional nomenclature, a high matchline node is an asserted matchline. The asserted matchline causes the data word associated with the matching CAM to be output from the CAM memory system.

Known CAM memory systems have at least one disadvantage when incorporated into high performance systems. Known CAM memory systems only allow a portion of one-half of a clock cycle for the match line note to drive the output of the associated memory element. Current and foreseeable high performance systems are designed to operate at clock speeds at or very near the physical limitations imposed by the system's manufacturing processes. Therefore, a portion of one-half of one clock cycle may be less than the minimum time required to evaluate an output data word.

SUMMARY OF THE INVENTION

In accordance with the present invention, there is disclosed a content addressable memory system having a latching circuit which substantially eliminates disadvantages of prior CAM systems.

The disclosed content addressable memory system has a plurality of associated circuit sets. Each circuit set has a tag memory element, a latching circuit and a data memory element. Each tag memory element has at least one content addressable memory cell coupled to an associated node. The content addressable memory cell stores a received data bit in a first mode of operation and compares a received data bit to a stored data bit in a second mode of operation. In the second mode of operation, the tag memory element couples a first voltage supply terminal to the associated node in response to the comparison. Each latching circuit latches the voltage level present on its associated node during a first phase of a control signal. Each data memory element stores a data word and outputs the data word responsive to the output of the associated latching circuit. Each latching circuit couples its associated node to a second voltage supply terminal during a second phase of the control signal.

In addition, a method of operating the claimed content addressable memory system is described. The method comprises a first and a second step corresponding to sequential first and second phases of a control signal, respectively. During the first phase of the control signal, each of a plurality of voltage levels present on a plurality of nodes is latched. Also, each of the plurality of nodes is coupled to a first voltage supply terminal. During the second phase of the control signal, a plurality of tag memory elements storing a plurality of tags compares an input tag to the contents of each tag memory element. Each of the plurality of tag memory elements couples a second voltage supply terminal to one of a plurality of nodes in response to the comparison.

BRIEF DESCRIPTION OF THE DRAWINGS

The features and advantages of the present invention will be more clearly understood from the following detailed description taken in conjunction with the accompanying FIGURES where like numerals refer to like and corresponding parts and in which.

DETAILED DESCRIPTION OF A PREFERRED EMBODIMENT

Figure 1:
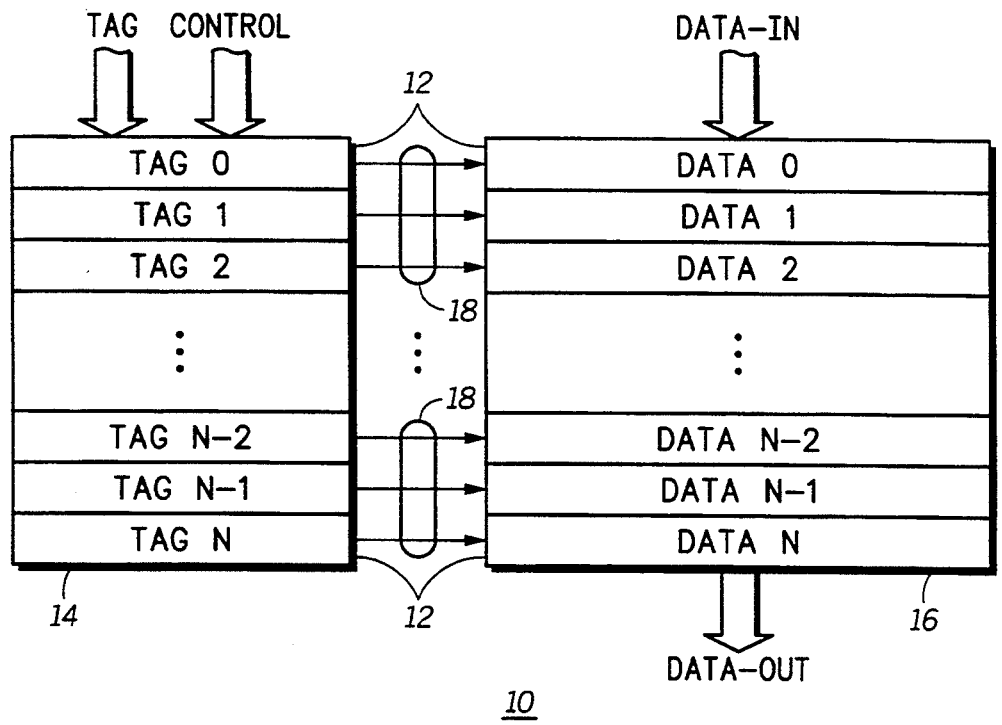
FIG. 1 depicts a block diagram of a CAM memory system constructed in accordance with the present invention.

FIG. 1 depicts a block diagram of a CAM memory system 10 constructed in accordance with the present invention. CAM memory system 10 has N+1 sets 12 of memory elements, where N is an integer. Each set 12 has one TAG memory element and one DATA memory element. The N+1 TAG memory elements form a block 14 of TAG memory elements, where the TAG memory elements are labeled TAG 0 through TAG N. The N+1 DATA memory elements form a block 16 of DATA memory elements, where the DATA memory elements are labeled DATA 0 through DATA N. All TAG memory elements receive the input signals TAG and CONTROL. Each TAG memory element generates one of a plurality wordline signals 18 and forwards the one wordline signal to the DATA memory element within the same set 12. Each DATA memory element also receives the input DATA-IN and generates the output DATA-OUT. As will be described below, CAM memory system 10 generates a DATA-OUT signal that is valid during both the first and second phase of a control clock cycle (one component of the signal CONTROL). This makes CAM memory system 10 suitable for data processing applications where the actual cycle time approaches the minimum cycle time allowed by the manufacturing processes.

In operation, CAM memory system 10 has three modes of operation: write, compare and read. In the first mode, write, a tag and a data word are written into a TAG memory element and a DATA memory element, respectively, of one set of memory elements 12. The tag and dam word are input to TAG memory element and DATA memory element through the signals TAG and DATA-IN, respectively. The particular set of memory elements 12 so written to may be selected by any one of a number of known algorithms not related to the present invention, including least recently used set (LRU), random set, invalid set, etc. In the second mode, compare, a tag is supplied to each of the TAG memory elements in block 14 through the input signal TAG. Each TAG memory element compares the data previously stored in it to the supplied tag. If the two match, then the matching TAG memory element will assert its matchline and, therefore, its wordline signal. As described above, an asserted matchline signal causes the DATA memory element associated with the matching TAG memory element to output a data word previously stored in the associated DATA memory element. In the third mode, read, the contents of a particular set of memory elements may be read by asserting the matchline associated with the particular set.

Figure 2:
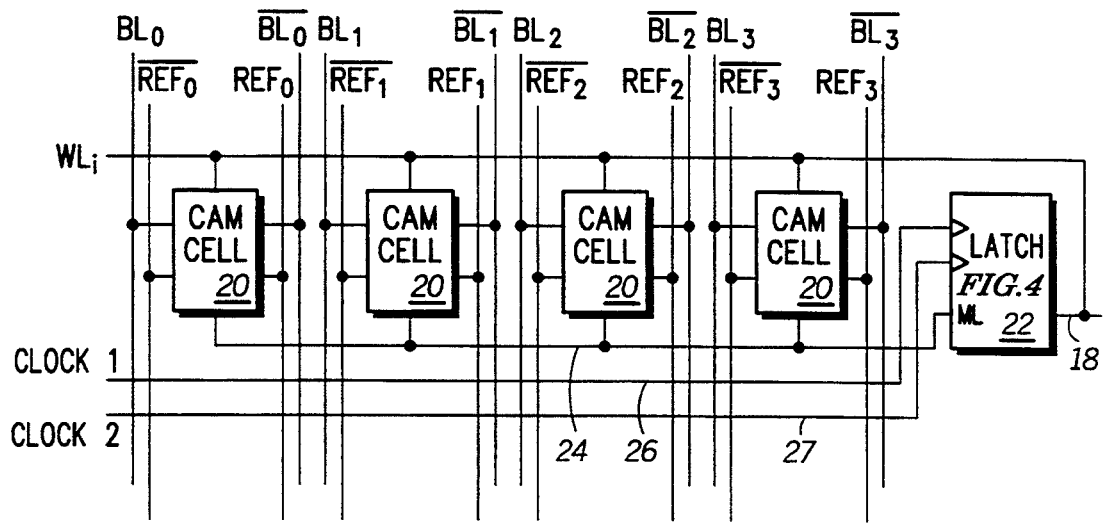
FIG. 2 depicts a block diagram of any one TAG memory element depicted in FIG. 1.

FIG. 2 depicts a block diagram of any TAG memory element depicted in FIG. 1. For purposes of illustration, FIG. 2 depicts the ith TAG memory element of block 14, where i is an integer index ranging from O to N. In the depicted embodiment, each TAG memory element stores four independent data bits in four CAM cells 20. CAM cells 20 are known in the art. The four TAG data bits are written to or read from the ith TAG memory element through the four pairs of bitline signals (labeled $BL_0$ / $\overline{BL_0}$ through $BL_3/\overline{BL_3}$ where the bar notation indicates the logical complement of a signal). One pair of bitline signals is connected to a selected differing one of CAM cells 20 in each TAG memory element within block 14. Four input reference TAG bits are compared to the contents of the ith TAG memory element through the four pairs of reference signals (labeled $Ref_0/\overline{Ref_0}$ through $Ref_3/\overline{Ref_3}$ where the bar notation indicates the logical complement of a signal). One pair of the reference signals is connected to a selected differing one of CAM cells 20 in each TAG memory element within block 14.

Each CAM cell 20 within the ith TAG memory element is connected to an ith latch circuit 22 of a set of N+1. latch circuits through an ith matchline node 24 of a set of N+1 matchline nodes. In the prior art, the ith matchline node 24 is logically AND'ed with a periodic clock signal or the complement of a periodic clock signal. The output of each logic combination then becomes the ith wordline. In the disclosed invention, the ith latch circuit 22 is also connected to a first and a second periodic clock signal 26 and 27 (labeled CLOCK1 and CLOCK2, respectively). Periodic clocking signals 26 and 27 are characterized by two alternating phases. Each phase of clock signals 26 and 27 correspond to one of two possible logic states. Latch circuit 22 generates the ith wordline signal (labeled $WL_i$) 18 for the ith DATA memory element. The ith wordline signal is also connected to each CAM cell 20 within the ith TAG memory element.

During a write operation, the ith wordline is asserted by a circuit (not shown) causing the ith TAG memory element to store the four-bit tag present on the four pairs of signals $BL_0/\overline{BL_0}$ through $BL_3/\overline{BL_3}$. Simultaneously, a data word associated with the four-bit tag is written into the ith DATA memory element 16. The ith DATA memory element is selected by the ith wordline signal as is known in the art.

A compare operation is more fully described in terms of a first and second phase of the signal CLOCK1. During the first phase of a compare operation, each latch circuit 22 precharges, or couples a first voltage supply terminal to the latch circuit's associated matchline node 24. During the second phase of a compare operation, each of the N+1 TAG memory elements compares the four data bits provided by the signal TAG with the four bits stored in each set of four CAM cells 20. If any of the four stored data bits within each set does not match the corresponding input tag bit, then the CAM cell 20 finding the mismatch will discharge the associated matchline node 24. For example, if the input tag is logically equivalent to 0010 (most to least significant bits) and the ith stored tag is logically equivalent to 0110, then the CAM cell 20 connected to the inputs $Ref_2/\overline{Ref_2}$ within the ith TAG memory element will discharge the ith matchline node 24. Finally, at the transition between the second phase of one clock cycle and the first phase of the next clock signal, each latch circuit 22 will latch the associated one of the N+1 logic states generated by the instant compare step. The ith latch circuit 22 outputs the ith logic value on the ith wordline 18 until the next clock signal transition.

It should be understood that every one of the TAG memory elements performs the same input-tag/stored-tag comparison during the second phase of clock signal 26. Therefore, each TAG memory element will either discharge or not discharge an associated match line node 24 depending upon the comparison. Similarly, each TAG memory element has its own latch circuit 22.

Each latch circuit 22 precharges the matchline associated with the particular TAG memory element during the first clock phase and latches the logic value present at the transition between second clock phase and the subsequent first phase.

The contents of the ith CAM memory element and the ith DATA memory element may be output as a conventional RAM or ROM by asserting the ith wordline.

Figure 3:
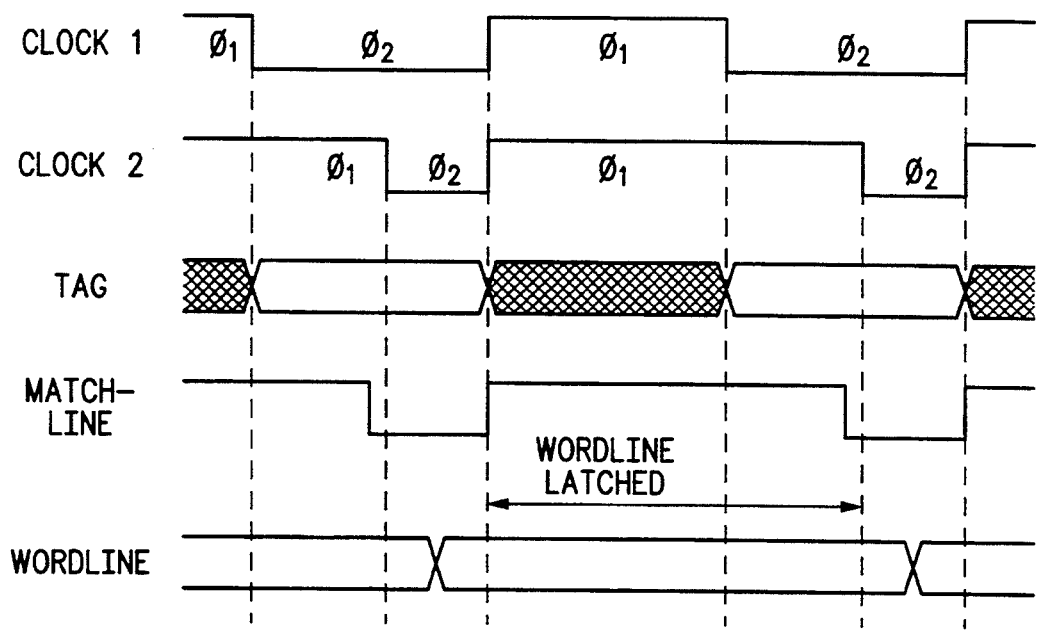
FIG. 3 depicts a timing diagram of the CAM memory system depicted in FIGS. 1 and 2.

FIG. 3 depicts a timing diagram 28 of the CAM memory system depicted in FIGS. 1 and 2. Timing diagram 28 depicts the three signals TAG, MATCHLINE and WORDLINE with respect to the first and second periodic clock signals 26 and 27 (CLOCK1 and CLOCK2, respectively).

As described above, the signals CLOCK1 and CLOCK2 are characterized by two cyclical phases (labeled $\Phi_1$ and $\Phi_2$). The duty cycle of the signal CLOCK2 is intentionally skewed with respect to CLOCK1 so that $\Phi_1$ is longer than $\Phi_2$. Each high-to-low transition of the signal CLOCK2 occurs later in time than the same transition of the signal CLOCK1. The low-to-high transitions of the two clock signals are generally contemporaneous. A circuit that accomplishes this skew is described below in connection with FIG. 5. The amount of skew added to the high-to-low transition of the signal CLOCK2 ensures that the signal CLOCK2 transitions low immediately after CAM memory system 10 evaluates each of the N+1 matchline nodes 18. This condition is indicated in FIG. 3 by the high-to-low transition of the signal MATCHLINE. The amount of skew added to the low-to-high transition of the signal CLOCK2 ensures that the signal transitions high immediately before CAM memory system 10 precharges each of the N+1 matchline nodes 18. This condition may be fulfilled by causing the low-to-high transition of both clock signals to occur simultaneously.

The signal TAG indicates that the address tenure of the four-bit tag occurs during the second phase of the signal CLOCK1.

The signal MATCHLINE represents the voltage present on matchline node 24. As depicted by the signal, MATCHLINE, latch circuit 22 precharges each matchline node 24 to a high logic state during the first phase of the signal CLOCK1. During the second phase of the signal CLOCK1, each TAG memory element may or may not discharge its corresponding matchline node 24 depending upon the match comparison. In some applications, the discharge of each matchline node 24 may occur relatively late in the second phase of signal CLOCK1. The signal WORDLINE depicts the output of latch circuit 22. Latch circuit 22 latches the logic value present on matchline node 24 after the signal CLOCK2 transitions from a low logic state (second phase) to a high logic state (first phase of the subsequent clock cycle). This transition may occur shortly after each input-tag/stored-tag comparison completes. This timing scheme allows each of the N+1 matchline nodes to drive the corresponding DATA memory elements for a period of time as long as an entire cycle of the signal CLOCK2 (equal to the cycle time of CLOCK1).

Without latch circuit 22, all N+1 of the WORDLINE signals would precharge to a high logic state at the beginning of both clock signals' first phase. In such a case, the act of precharging would effectively erase the data present on each of the N+1 matchline nodes at the end of the second phase of both clock signals. Each TAG memory element could then only drive its associated DATA memory element for a fraction of the second phase of the signal CLOCK2.

Figure 4:
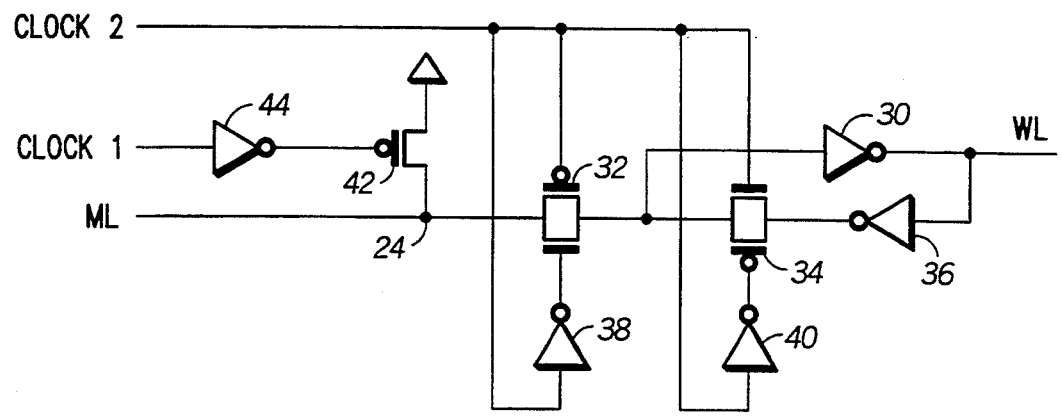
FIG. 4 depicts a partial schematic diagram of the latch circuit depicted in FIG. 2.

FIG. 4 depicts a partial schematic diagram of the latch circuit 22 depicted in FIG. 2. The output signal WORDLINE (labeled $WL_i$) is generated by an output of an inverter 30. An input of inverter 30 is connected to a first terminal of a switch or a pass gate 34 and to a first terminal of a switch or a pass gate 32. The output of inverter 30 is also connected to an input of an inverter 36. An output of inverter 36 is connected to a second terminal of pass gate 34. A gate of a P-channel device of pass gate 32 and a gate of an N-channel device of pass gate 34 are connected to the signal CLOCK2. A gate of an N-channel device of pass gate 32 and a gate of a P-channel device of pass gate 34 are connected to an output of an inverter 38 and to an output of an inverter 40, respectively. An input of inverter 38 and an input of inverter 40 are connected to the signal CLOCK2. A second terminal of pass gate 32 is connected to matchline node 24. Matchline node 24 receives the input signal MATCHLINE (labeled ML). Matchline node 24 is also connected to a drain of a P-channel transistor 42. A source of transistor 42 is connected to a voltage supply terminal corresponding to a high logic state. A gate of transistor 42 is connected to the output of an inverter 44. An input of inverter 44 receives the input signal CLOCK1.

Latch circuit 22 has two phases of operation corresponding to the two logic states or phases of the signals CLOCK1 and CLOCK2. In the first phase of operation, the signal CLOCK2 corresponds to a high logic state. In this first phase, pass gate 34 is in a conducting state and pass gate 32 is in a non-conducting state. Inverters 30 and 36 thereby form a latch retaining the logic value present at node 24 immediately before the low-to-high transition of the signal CLOCK2. Transistor 42 simultaneously precharges matchline node 24 to a high logic state during a portion of the first phase of the signal CLOCK2 (the first phase of the signal CLOCK 1). During the first phase of operation, the changing voltage level at matchline node 24 does not effect the output of inverter 30. In the second phase of operation, the signal CLOCK2 corresponds to a low logic state. In this second phase, pass gate 34 is in a non-conducting state and pass gate 32 is in a conducting state. Therefore, the voltage at node 24 directly passes to the output of inverter 30. During the second phase of operation, the changing voltage level at matchline node 24 is directly passed to the output of inverter 30.

Figure 5:
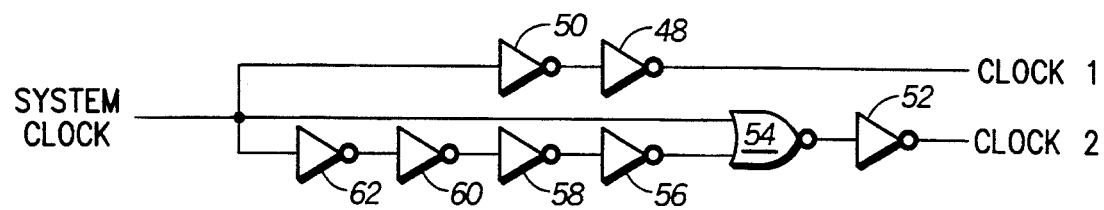
FIG. 5 depicts a logic diagram of a skewing circuit operable to generate the signals CLOCK1 and CLOCK2 depicted in FIG. 3.

FIG. 5 depicts a logic diagram of a skewing circuit 46 operable to generate the signals CLOCK1 and CLOCK2 depicted in HG. 3. The signals CLOCK1 and CLOCK2 are generated from a common periodic clock signal (labeled SYSTEM CLOCK). An output of an inverter 48 generates the signal CLOCK1. An input of inverter 48 is connected to an output of an inverter 50. An input of an inverter 50 is connected to the signal SYSTEM CLOCK. An output of an inverter 52 generates the signal CLOCK2. An input of inverter 52 is connected to an output of a NOR gate 54. A first input of NOR gate 54 is connected to the signal SYSTEM CLOCK. A second input of NOR gate 54 is connected to an output of an inverter 56. An input of inverter 56 is connected to an output of an inverter 58. An input of inverter 58 is connected to an output of an inverter 60. An input of inverter 60 is connected to an output of an inverter 62. An input of inverter 62 is also connected to the signal SYSTEM CLOCK.

The propagation delay through NOR gate 54 and inverter 52 is generally equal to the propagation delay through inverters 48 and 50. Therefore, the low-to-high transition occurs simultaneously for both signals CLOCK1 and CLOCK2. However, inverters 56, 58, 60 and 62 cause a propagation delay for the signal CLOCK2 that is not duplicated for the signal CLOCK1. The propagation delay caused by these four inverters causes the high-to-low transition of the signal CLOCK2 to occur after the high-to-low transition of the signal CLOCK1. As described above, the skew added to the first phase of the signal CLOCK2 causes the high-to-low transition of the signal CLOCK2 to occur after each of the N+1 matchline nodes to evaluate to either a high or a low logic state.

The disclosed invention is useful in cache memory systems which allow "snooping." As described above, a CAM memory system may be used to store frequently used memory and source addresses of the memory, a cache, for use by a data processing system. In some data processing systems, a cache may access data stored in a main memory system that is also accessed by other systems. One example of such a system is a multiprocessor data processing system. In a multiprocessor data processing system, several data processors, usually individual microprocessors, each has a cache memory system incorporating a CAM memory system. However, all multiprocessors in the data processing system share a single main memory system. Various protocols known in the art exist to maintain data coherency when data may be modified while in a cache.

In general, "snooping" is the process by which each microprocessor (in the present example) monitors a data bus common to all microprocessors to determine if the data within one or more of the microprocessors is no longer valid. The operation of another microprocessor may modify the data value thereby invalidating older, unmodifed copies of the data. Generally, each microprocessor in the multiprocessor data processing system broadcasts its cache data write operations on the data bus to indicate such an invalidating operation to other microprocessors. For example, if a particular microprocessor modifies a copy of a data word resident in its cache by incrementing the value of the data word, then the microprocessor will broadcast the address of the modified data on the data bus. Every other microprocessor may then invalidate every old unincremented copy of the data. This prevents the other microprocessors from using an incorrect copy of the data. Each copy of data stored in a cache typically has a valid bit associated with it to facilitate such an invalidation operation.

The disclosed invention facilitates a single cycle status update in a snooping data processing system. A data processing system containing CAM memory system 10 must determine if it has a copy of the affected data and if so, invalidate it, after the data processing system detects a data invalidating operation. During the second phase of the signal CLOCK1, a data processing system inputs all or a selected portion of the address of the snooped operation to each TAG memory element 14. If the data identified by the snooped tag is present in CAM memory system 10, then one matchline node 24 will not discharge. This matchline node will drive its corresponding DATA memory element 16. During the subsequent first phase of the signal CLOCK2, the data processing system may then write a logic value corresponding to an invalid entry into the bit allocated for the validity status of the associated DATA memory element. This bit may be located in either the TAG memory element or the DATA memory element. As described above, the ith TAG memory element or the ith DATA memory element may be written into by applying input data on the bitline signals while the ith wordline is asserted. Other types of write operations may occur to CAM memory system 10 in the same manner as necessary to the operation of the data processing system. These single-cycle write operations may be associated with other memory coherency protocols or simply with data stores to selected TAG or DATA memory elements.

Although the present invention has been described with reference to a specific embodiment, further modifications and improvements will occur to those skilled in the art. For instance, other latch circuits may be appropriate given other semiconductor manufacturing processes. Or, more complicated timing schemes may be necessary to support more complex timing constraints of a preexisting circuit incorporating the disclosed invention. It is to be understood therefore, that the invention encompasses all such modifications that do not depart from the spirit and scope of the invention as defined in the appended claims.

What is claimed is:

1. A content addressable memory system comprising:
   a plurality of tag memory elements, each of the plurality of tag memory elements comprising:
   a node; and
   at least one content addressable memory cell coupled to the node, the content addressable memory cell storing a received data bit in a first mode of operation, the content addressable memory cell comparing a received data bit to a stored data bit and coupling a a matchline control signal to the node responsive to the comparison in a second mode of operation, the comparison during a second phase of a first control signal, the first control signal characterized by sequential first and second phases,
   a plurality of latching circuits, each of the plurality of latching circuits coupled to a selected differing ones of the nodes, to aterminal for receiving the first control signal, to a terminal for receiving a second control signal, the first control signal characterized by sequential first and second phases, the latching circuit operable to latch a voltage level present on each of the plurality of nodes during the first phase of the second control signal and operable to couple each of the nodes to a first voltage supply terminal during the first phase of the first control signal, each of the plurality of latching circuits generating a latched voltage; and
   a plurality of data memory elements, each of the plurality of data memory elements coupled to a selected differing one of the plurality of latching circuits, each of the plurality of memory elements storing a data word and outputting the data word responsive to the latched voltage of the selected one of the plurality of latching circuits.

2. The content addressable memory system of claim 1 wherein each of the plurality of latching circuits comprises:
   a transistor comprising a first current electrode, a second current electrode and a control electrode, the first current electrode coupled to the first voltage supply terminal, the second current electrode coupled to the selected differing one of the nodes, the control electrode coupled to the first control signal;

a switch means comprising a first and a second terminal, the first terminal coupled to the node, the first and second terminals in a high impedance state responsive to the first phase of the second control signal, the first and second terminals electrically short-circuited responsive to the second phase of the second control signal; and a latch coupled to the second terminal of the switch means.

3. A content addressable memory system comprising:

tag means for storing a plurality of received tags and for comparing a received tag and the plurality of received tags, the tag means operable to generate a plurality of voltage levels in response to the comparison;

latching means coupled to the tag means, the latching means generating a plurality of latched voltage levels, the plurality of latched voltage levels logically equivalent to the plurality of voltage levels at a predetermined time; and data memory means for storing a plurality of data words, each of the plurality of data words associated with a selected one of the plurality of received tags, the data memory means operable to output a selected one of the plurality of data words in response to the plurality of latched voltage levels.

4. The content addressable memory system of claim 3 wherein the tag means further comprises precharge means for generating a plurality of predetermined voltage levels.

5. A method of operating a content addressable memory system comprising the steps of:

during a first phase of a first and a second control signal, each of the first and second control signals comprising sequential first and second phases, latching a plurality of voltage levels, each of the plurality of voltage levels present on a differing selected one of a plurality of nodes and during a second phase of the first control signal coupling a first voltage supply terminal to each one of the plurality of nodes; and during the second phase of the first control signal, comparing an input tag to a plurality of stored tags, each of the plurality of stored tags stored in a selected differing one of a plurality of tag memory elements, each of the plurality of memory tag elements associated with a selected differing one of the plurality of nodes, each of the plurality of memory tag elements coupling a matchline control signal to the associated selected node responsive to the comparing.

6. The method of claim 5 wherein the step of latching a plurality of voltage levels comprises the step of outputting a determined one of a plurality of stored data words, each of the plurality of stored data words stored in a determined differing one of a plurality of data memory elements, the selected one of the plurality of stored data words responsive to the comparing step.

7. The method of claim 6 further comprising the step of storing a predetermined data bit in a selected one of the plurality of data memory elements or in a selected one of the plurality of tag memory elements during a subsequent first phase of the control signal, the selected one of the plurality of data memory elements or the selected one of the plurality of tag memory elements responsive to the comparing step.

8. The method of claim 5 further comprising the step of storing a predetermined data bit in a selected one of a plurality of data memory elements or in a selected one of a plurality of tag memory elements during a subsequent first phase of the control signal, each of the plurality of data memory elements associated with a selected differing one of the plurality of tag memory elements, the selected one of the plurality of data memory elements or the selected one of the plurality of tag memory elements responsive to the comparing step.

* * * * *